United States Patent [19]
Grider et al.

[11] Patent Number: 5,818,100
[45] Date of Patent: Oct. 6, 1998

[54] PRODUCT RESULTING FROM SELECTIVE DEPOSITION OF POLYSILICON OVER SINGLE CRYSTAL SILICON SUBSTRATE

[75] Inventors: Douglas T. Grider, Pleasanton; Jon S. Owyang, San Jose, both of Calif.

[73] Assignee: LSI Logic Corporation, Milpitas, Calif.

[21] Appl. No.: 823,829

[22] Filed: Mar. 25, 1997

Related U.S. Application Data

[60] Continuation of Ser. No. 566,161, Nov. 30, 1995, abandoned, which is a division of Ser. No. 374,193, Jan. 18, 1995, Pat. No. 5,646,073.

[51] Int. Cl.⁶ .................................................. H01L 31/117
[52] U.S. Cl. .......................... 257/616; 257/755; 257/382; 257/384; 257/554; 257/576
[58] Field of Search ............................. 257/755, 616, 257/377, 382, 384, 554, 576

[56] References Cited

U.S. PATENT DOCUMENTS 5,091,760  2/1992  Maeda et al. ............................ 257/377
5,268,324  12/1993  Aitken et al. ............................. 437/57

FOREIGN PATENT DOCUMENTS 4-225568  8/1992  Japan ..................................... 257/382

*Primary Examiner*—Mark V. Prenty
*Assistant Examiner*—Nathan Kelly
*Attorney, Agent, or Firm*—John P. Taylor

[57] ABSTRACT

A method, and resulting product, are disclosed for selectively forming polycrystalline silicon over exposed portions of a single crystal silicon substrate. The method includes inhibiting the formation of such polycrystalline silicon over adjacent silicon oxide surfaces; and the resulting product of such a process. The polycrystalline silicon is selectively deposited over the single crystal silicon substrate by first forming a thin layer of a lattice mismatched material over the single crystal silicon surface, and then depositing a layer of polycrystalline silicon over the lattice mismatched material. Preferably, the thin lattice mismatched layer comprises a silicon/germanium (SiGe) alloy.

22 Claims, 4 Drawing Sheets

FORMING A THIN LAYER OF A SILICON/GERMANIUM ALLOY OVER PORTIONS OF A SINGLE CRYSTAL SILICON SUBSTRATE WHERE SHALLOW SOURCE/DRAIN REGIONS WILL BE FORMED TO THEREBY REMOVE NATIVE OXIDES FROM THE SILICON SUBSTRATE SURFACE AND TO FORM A LAYER OF LATTICE MISMATCHED MATERIAL OVER THE SINGLE CRYSTAL SILICON SUBSTRATE

SELECTIVELY DEPOSITING A LAYER OF POLYSILICON OVER THE SURFACE OF THE GERMANIUM/SILICON LATTICE MISMATCHED LAYER TO PROVIDE A SACRIFICIAL POLYSILICON LAYER OVER THE SURFACE OF THE SILICON SUBSTRATE WHICH MAY BE IMPLANTED WITH DOPANT AND SUBSEQUENTLY REACTED WITH A METAL TO FORM SILICIDE CONTACTS OVER THE SOURCE/DRAIN REGIONS IN THE SILICON SUBSTRATE

FIG. 6

PRODUCT RESULTING FROM SELECTIVE DEPOSITION OF POLYSILICON OVER SINGLE CRYSTAL SILICON SUBSTRATE

This application is a continuation of U.S. patent application Ser. No. 08/566,161, filed Nov. 30, 1995, now abandoned, which is a division of U.S. patent application Ser. No. 08/374,193, filed Jan. 18, 1995, U.S. Pat. No. 5,646,07 .

BACKGROUND OF THE INVENTION

1. Field of the Invention

This invention relates to the selective deposition of polysilicon over a single crystal silicon substrate. More particularly, the invention relates to a process which permits selective formation of poly crystalline silicon over exposed portions of a single crystal silicon substrate by interposing a thin layer of lattice mismatched material between the single crystal silicon material and the polycrystalline silicon.

2. Description of the Related Art

The continued scaling down of the dimensions of integrated circuit structures places much more stringent requirements on both the lateral and vertical dimensions of the active devices, such as MOS and bipolar devices, which form a part of such integrated circuit structures.

Thus, for example, the resulting shrinkage of an MOS transistor, resulting in a smaller (shorter) channel results in a need for smaller (shallower) source/drain junctions with the channel region, since lateral diffusion of the source/drain dopants beneath the gate electrode and into the channel region (resulting in an undesirable shortening of the channel) increases with the depth of the source/drain regions. If the gate and underlying channel have a length of 0.25 micrometers ($\mu$m), the required depth of the source/drain junctions with the channel should be less than about 1000 Angstroms (Å).

However, both the fabrication of such shallow depth source/drains regions and the formation of contacts to such regions are difficult. Since ion-implantation is the preferred method of forming the source/drain regions, reduction of the depth of the desired source/drain region results in increased problems of control of the ion-implantation, with channeling problems occurring as well as increased difficulties in providing sufficient annealing to remove damage to the substrate caused by such implantation without excessive diffusion. For shallow junctions, such implantation damage will interact electrically to produce undesirable leakage currents.

The formation of contacts to such shallow source/drain regions using conventional silicide formation over the source/drain regions is also rendered more difficult as the depth of the source/drain regions shrink. The silicide thickness should be limited to less than half the initial depth of the underlying source/drain regions to maintain desirable electrical performance by the source/drain regions. Thus, for source/drain regions having a depth of 1000 Å or less, the silicide thickness should be less than 500 Å, i.e., about 400 Å. Formation of a titanium silicide contact of this thickness over such a shallow source/drain region would require an initial deposition of only about 175 Å of titanium, a deposition thickness which is difficult to control, and such a thin titanium silicide contact does not result in a sufficiently low sheet resistance.

To overcome such problems of contact formation to such shallow source/drain regions, an alternate which has been proposed is to elevate the source/drain regions above the substrate surface by the selective deposition of further material, e.g., silicon, over the silicon substrate. By selectively depositing a sacrificial layer over the source/drain regions, one can produce an effectively thicker source/drain region (vertically) while maintaining an electrically shallow lateral junction with the adjacent channel within the original substrate. That is, the deposited region above the original silicon substrate surface will not impact the electrical junction depth, but instead only serve to make contact to the source/drain junctions easier.

In a simple application of such an elevated source/drain region, silicon may be selectively deposited (i.e., deposited only over the silicon and not the adjacent silicon oxide insulating surfaces) after formation (implantation) of the source/drain regions and be used only as a sacrificial layer during self-aligned silicide formation, in which case such a deposition allows thicker silicides to be formed on electrically shallow junctions. At the same time, if the additional deposited silicon is undoped, such silicide formation will result in equal thicknesses formed over either $N^+$–P and $P^+$–N junctions by eliminating interactions between dopants, such as arsenic, with the silicide. An additional advantage of an elevated source/drain MOS structure is a potential increase in packing density, because peripheral contacts can be allowed. Since the selectively deposited layer will overlap the field edge, contacts can be placed directly on the elevated source/drain regions without the requirement for excessive contact enclosure and without causing junction leakage as can happen in non-elevated source/drain regions when the contact at the field edge spikes through the source/drain junction under the field edge causing leakage.

Such a selectively deposited layer of silicon may also be used as a solid diffusion source to form the source/drain regions. First the layer is selectively deposited on the source/drain regions prior to source/drain dopant introduction (implantation). The deposited layer is then doped by ion implantation and the dopants implanted into the additional or sacrificial layer are subsequently driven into the underlying silicon substrate by thermal annealing, resulting in the desired very shallow source/drain regions in the substrate and resultant very shallow lateral electrical junctions with the channel beneath the gate electrode. By carefully choosing the thickness of the deposited layer and the implant energy, the implant can be completely confined within the selectively deposited layer to avoid substrate damage. Because of the added thickness of this layer, conventional implantation techniques may be used, allowing the continued used of existing equipment and process parameters.

However, when the additional layer of silicon is used as a solid diffusion source, as well as a sacrificial layer, the selectively deposited layer must exhibit certain properties. In order to produce shallow, abrupt junctions, dopant diffusivities in the selectively deposited layer must be high such that dopants will rapidly diffuse vertically through the layer to the original silicon surface. At this point, diffusion in the substrate proceeds normally with no interactions between the diffusing species and no damage associated with the implant process (since the shallow implant is limited to the selectively formed layer over the substrate and does not penetrate into the substrate).

Formation of such a sacrificial silicon layer by epitaxial growth of silicon would be advantageous because of the selectively of such epitaxial growth over only the exposed portions of the silicon surface, and not over adjacent silicon oxide surfaces. This is shown in prior art FIG. 1 wherein a silicon substrate 2, having field oxide portions 6, is shown having surface areas 10 beneath which source and drain regions will be subsequently formed in substrate 2. A gate electrode 12 is shown formed over gate oxide 14. Oxide spacers 16 are shown formed on the sidewall of gate electrode 12 to insulate gate electrode 12 from the source/drain electrode contacts which will be subsequently formed over surface areas 10. As shown in FIG. 1, the native silicon oxide which would normally be present over surface areas 10 has been previously removed by an HCl etch, and epitaxial silicon layer 20 has been selectively formed over surfaces areas 10.

However, as stated above, such an epitaxial growth of silicon over surface areas 10 requires the prior removal of the native oxide over the silicon substrate surface by an etching process which, if not carefully controlled, may result in the concurrent removal of, or damage to, the oxide spacers on the sidewalls of the silicon gate electrode, risking possible shorts between the gate electrode and the source/drain electrodes. Furthermore, such an epitaxial silicon layer would have the same properties as the underlying single crystal silicon substrate, including the same slow diffusion properties, making control of the diffusion of dopants into the source/drain regions harder to control. That is, lateral diffusion of the dopant is still a problem because of the slow rate of diffusion of the dopant through the epitaxial silicon into the substrate.

On the other hand, while the rate of diffusivity of polysilicon would be much greater than epitaxial silicon (as much as 100 times greater), polysilicon would deposit non-selectively over both the silicon substrate and over adjacent silicon oxide (e.g., field oxide) surfaces as well. This is shown in FIG. 2, wherein native oxide portions 18 are shown overlying surface areas 10, and a layer 22 of polysilicon is shown non-selectively deposited not only on native oxide portions 18 overlying surface areas 10, but also over the surfaces of field oxide portions 6 as well.

To obtain selectivity in a silicon deposition would require removal of the native oxide overlying the silicon substrate, with the concomitant problems already described, and the resulting silicon layer deposited would then be single crystal (epitaxial) silicon rather than polycrystalline, thus defeating the attempt to increase the diffusivity rate of the dopant through the silicon layer.

It has been proposed to form such elevated source/drain regions by deposition of a layer of a silicon/germanium (SiGe) alloy. Such SiGe deposition would provide high selectivity in deposition on the underlying silicon in preference to silicon oxide. Furthermore, the large lattice mismatch between the SiGe alloy and the silicon substrate would result in the deposition of a polycrystalline layer which provides the defects and grain boundaries which act as pipelines to more rapidly introduce dopants to the underlying silicon substrate than would single crystal material such as the previously described epitaxial silicon material, resulting in a dopant diffusivity of approximately 10 times that of single crystal silicon. This is shown in FIG. 3 wherein a layer 24 of a SiGe alloy has been selectively formed over surfaces areas 10 of silicon substrate 2.

However, polycrystalline silicon exhibits a dopant diffusivity of approximately 100 times that of single crystal silicon, i.e., much greater than the aforesaid SiGe alloy. Hence, polycrystalline silicon would be the material of choice for the formation of such raised source/drain regions, were it not for the inability to deposit polysilicon selectively over only the silicon substrate and not on the adjacent silicon oxide surfaces as well.

SUMMARY OF THE INVENTION

The invention comprises a method of selectively depositing polycrystalline silicon over exposed portions of a single crystal silicon substrate while inhibiting the deposition of such polycrystalline silicon over adjacent silicon oxide surfaces; and the resulting product of such a process.

The polycrystalline silicon is selectively deposited over the single crystal silicon substrate by first forming a thin layer of a lattice mismatched material over the single crystal silicon surface and then depositing a layer of polycrystalline silicon over the lattice mismatched material. Preferably, the thin lattice mismatched layer comprises a silicon/germanium (SiGe) alloy.

BRIEF DESCRIPTION OF THE DRAWINGS

FIG. 6 is a flow sheet illustrating the process of the invention.

DETAILED DESCRIPTION OF THE INVENTION

Figure 1:
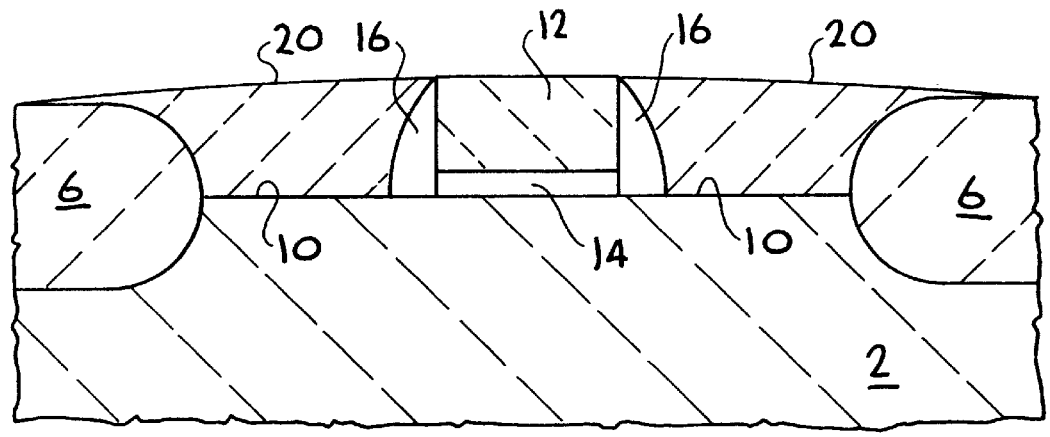
FIG. 1 is a vertical cross-sectional view of a prior art MOS structure in which shallow source/drain regions will be formed showing a raised epitaxial silicon layer selectively grown over the exposed of the silicon substrate where the source/drain regions will be formed..

The invention comprises a process for selectively depositing raised polysilicon layers over exposed portions of a single crystal silicon substrate, such as source/drain regions, preferably shallow source/drain regions, in the silicon substrate, while inhibiting the deposition of such polycrystalline silicon over adjacent silicon oxide surfaces, and the resulting product of such a process.

The process of selectively depositing polycrystalline silicon over a single crystal silicon substrate comprises first forming a thin layer of a lattice mismatched material over the single crystal silicon surface, and then depositing a layer of polycrystalline silicon over the lattice mismatched material. Preferably, the thin lattice mismatched layer comprises a SiGe alloy. However, other materials may be used in the formation of the thin lattice mismatched layer, as will be discussed below. The germanium in the SiGe layer reduces the underlying native oxide, resulting in a selective deposit over only the underlying silicon, in preference to adjacent silicon oxide surfaces; yet the lattice mismatched SiGe alloy results in the subsequent seeding of a polycrystalline deposition of silicon over the lattice mismatched SiGe layer.

The thin layer of lattice mismatched material, which is initially formed selectively over the exposed single crystal silicon and not over the surfaces of the field oxide portions of the structure, must comprise a material capable of reacting with (reducing) the underlying native oxides on the surface of the silicon substrate where the source/drain regions will be formed in the substrate. Typically this means that the lattice mismatched material must be capable of reacting with or reducing the native oxide, i.e., silicon oxide, to form a volatile species which will be removed from the subatmospheric reaction chamber via the gas exhaust pumping system, e.g., the vacuum pump.

The lattice mismatched material must also be capable of forming/nucleating a layer which will prevent/inhibit the subsequently deposited polycrystalline silicon from using the underlying single crystal silicon substrate surface as a nucleating surface for epitaxial growth. That is, polysilicon, not epitaxial silicon, must be deposited during the subsequent silicon deposition as a result of the presence of the lattice mismatched material.

The layer of lattice mismatched material must also comprise a material having a melting point higher than those temperatures which will be subsequently used in the further processing of the integrated circuit structure. For example, while pure germanium, i.e., germanium not alloyed with silicon, may be used, as will be discussed below, it is preferably to alloy germanium with at least some silicon to raise the melting point of the resulting alloy above the melting point of pure germanium, which is about 937° C.

Finally, the thin layer of lattice mismatched material must comprise a material which will be compatible with the remainder of the integrated circuit structure, i.e., must not comprise a material which will interfere with the subsequent formation of the MOS devices or any other type of devices to be formed as a part of the integrated circuit structure. Typically, this will mean that the lattice mismatched deposition product remaining after reduction and volatilization of the native oxides will be a thermally and chemically stable compound capable of providing a nucleating surface for the formation of a polycrystalline layer of silicon, i.e., polysilicon, thereon.

Typical materials which may be used in the formation of the thin lattice mismatch layer include, by way of example and not of limitation, germanium, silicon/germanium alloys, silicon/germanium/carbon compounds, Group III–V compounds sufficiently stable so as to not provide an undesirable source of dopant materials, and Group II–VI compounds.

The thickness of the thin layer of lattice mismatched material will functionally range from the minimum thickness needed to prevent single crystal growth of the silicon subsequently deposited thereon and to provide a sufficient amount of silicon oxide reducing agent to result in removal of the native oxide on the exposed silicon substrate, up to a maximum thickness which will not unduly inhibit the diffusion rate of the dopant implanted in the overlying polysilicon layer through the thin lattice mismatched layer into the source/drain region in the silicon substrate. By unduly, is meant an amount which will not reduce the diffusion rate of the dopant from the polysilicon layer through the lattice mismatched layer into the source/drain region in the substrate by more than about 10% of the diffusion rate which would exist if no such lattice mismatched layer were present.

By way of illustration, and not of limitation, if the lattice mismatched material comprises a SiGe alloy, the thickness of the lattice mismatched layer may range from about 50 Å to about 500 Å, depending upon the concentration of germanium in the alloy. The higher the germanium content the more germanium will be available to reduce the native oxide (silicon oxide) on the surface of the substrate and the greater the lattice mismatch will be. Therefore, the greater the germanium content in the alloy, the thinner the lattice mismatched layer need be. For example, if the germanium content would be as low at 30%, by wt., the layer would have to be about 400 Å in thickness to supply sufficient germanium for the native oxide reduction reaction, and to provide a sufficiently mismatched lattice. However, if the germanium content was 100%, the lattice mismatched layer could be as thin as 10 Å. The germanium content in the SiGe alloy may range from at little as 1 wt. % germanium to as high as 99.9+wt. %. Preferably, however, the wt. % of germanium in the alloy will vary from 25–99.9+wt. %, and most preferably from 25–70 wt. %.

The thin layer of lattice mismatched material may be formed over the silicon substrate by any convenient deposition process including, by way of example, chemical vapor deposition (CVD) type processes. It should, perhaps be noted that while the lattice mismatched material will also react with the oxide insulation surfaces, including both the field oxide and the oxide spacers formed on the side of the polysilicon gate electrode, as well as the native oxide overlying the source/drain regions to be formed in the silicon substrate, the native oxide is much thinner and of a porous nature which results in its reacting faster with the lattice mismatched material that the other oxide surfaces present. Furthermore since only a very thin layer of the lattice mismatched material is formed, an insignificant amount of the field oxide or gate electrode sidewall oxide spacers is removed during the short period of time needed to react with the native oxide to remove it from the substrate surface and then to deposit the thin layer of lattice mismatched material.

For example, the thin layer of lattice mismatched material may be formed by a rapid thermal CVD type deposition wherein a cold (room temperature) substrate is placed in a cold (room temperature) deposition chamber and rapidly heated radiantly, i.e., by heat lamps shining on the substrate which rapidly heat the substrate to a temperature of about 600°–650° C. Gases containing the reactants are flowed into the chamber for about 5–30 seconds, preferably about 10–15 seconds, while the pressure is preferably maintained in the deposition chamber in a range of from about 10 Torr to about 500 Torr.

For the deposition of a thin layer SiGe alloy as the lattice mismatched material, silane gas or a halogenated silane gas, e.g., mono-, di-, tri-, or tetrachlorosilane, may be flowed into the deposition chamber as the source of silicon, while germane gas or a halogenated germane gas, e.g., mono-, di-, tri-, or tetrachlorogermane, may be flowed into the chamber as the source of germanium.

After deposition of the thin layer of lattice mismatched material, polycrystalline silicon may be selectively deposited over the lattice mismatched material using any conventional silicon deposition process capable of selectively depositing polycrystalline silicon over the thin layer of lattice mismatched material without also depositing the silicon over the field oxide surfaces as well. The thickness of the deposited layer may vary with the minimum thickness functionally limited to the minimum thickness which will permit subsequent implantation of dopants to be carried out substantially within the depth of the polysilicon layer. The maximum thickness will be functionally controlled by the amount of silicide to be subsequently formed, since the polysilicon layer will normally act as a sacrificial layer providing the source of silicon for a metal silicide contact to be formed by reaction between the silicon layer and a metal layer, e.g., titanium, deposited over the silicon layer and then reacted with it to form the metal silicide source/drain contacts. Typically the polysilicon layer formed over the lattice mismatch layer will range from a minimum of about 500 Å up to a maximum of about 2000 Å.

Figure 4:
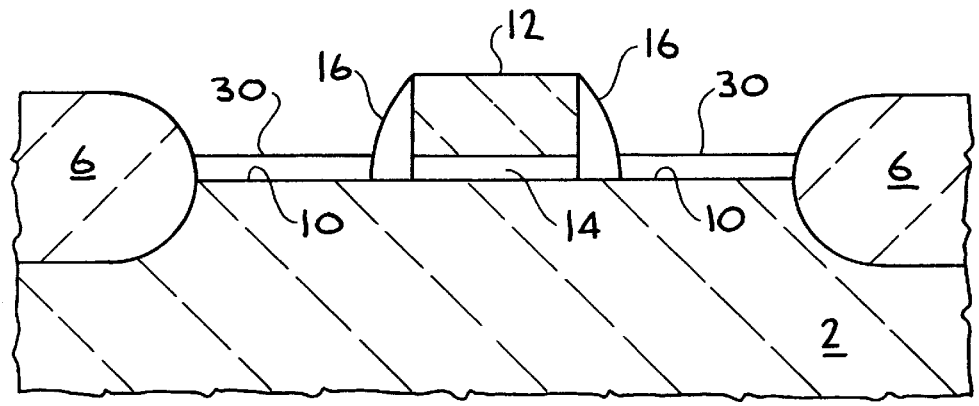
FIG. 4 is a vertical cross-sectional view of an MOS structure in which shallow source/drain regions will be formed with a lattice mismatched thin layer of a SiGe alloy selectively formed, in accordance with the invention, over the exposed regions of the silicon substrate where the source/drain regions will be formed.

Turning to FIG. 4, the first step of the process of the invention is shown wherein a thin layer 30 of lattice mismatched material such as a SiGe alloy has been selectively deposited over surface areas 10 of silicon substrate 2. It will be noted that there is no underlying native oxide 18, because the native oxide has been reduced by reaction with the germanium in the SiGe alloy during the deposition.

Figure 2:
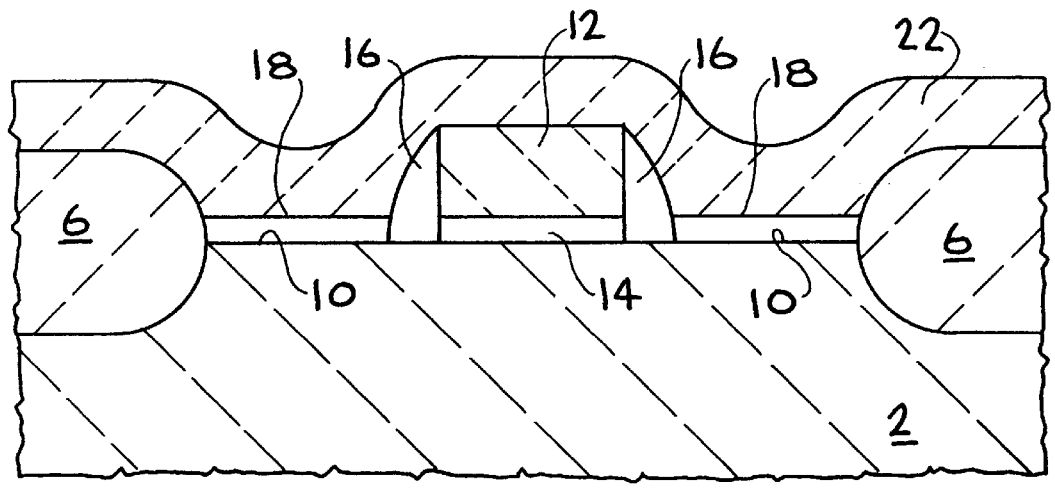
FIG. 2 is a vertical cross-sectional view of a prior art MOS structure in which shallow source/drain regions will be formed showing a raised polysilicon layer non-selectively deposited over the exposed regions of the silicon substrate where the source/drain regions will be formed, as well as over the adjoining silicon oxide insulation surfaces.
Figure 3:
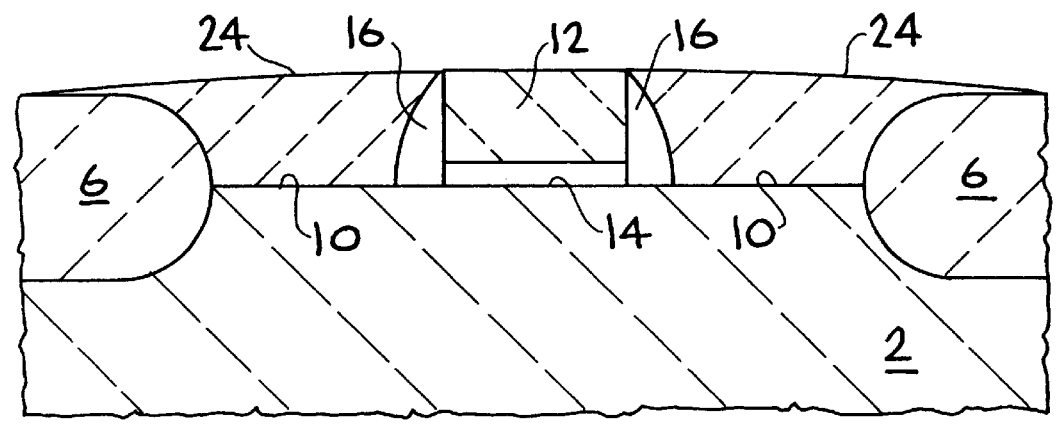
FIG. 3 is a vertical cross-sectional view of a prior art MOS structure in which shallow source/drain regions will be formed with a raised silicon/germanium (SiGe) alloy layer selectively grown over the exposed portion of the silicon substrate where the source/drain regions will be formed.
Figure 5:
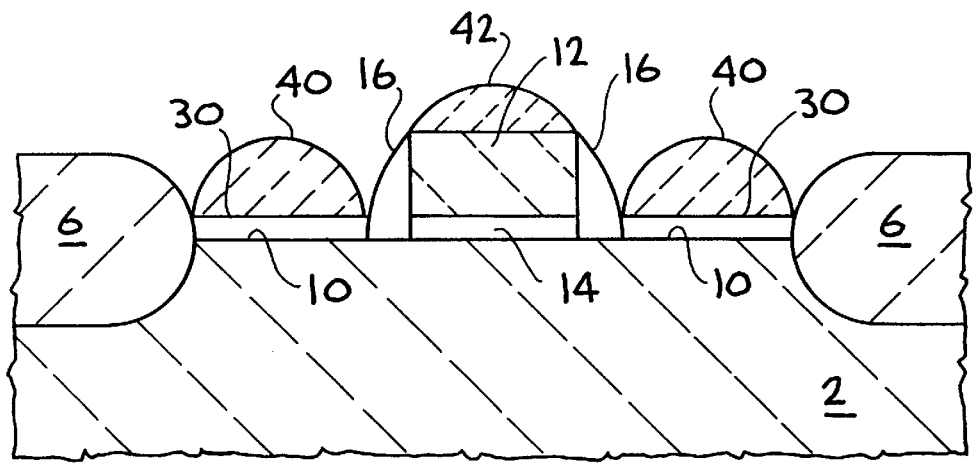
FIG. 5 is a vertical cross-sectional view of an MOS structure in which shallow source/drain regions will be formed, with a raised polysilicon layer selectively deposited, in accordance with the invention, over the thin layer of lattice mismatched SiGe alloy formed over the exposed regions of the silicon substrate.

FIG. 5 shows the subsequent selective deposition of polysilicon 40 over thin lattice mismatch layer 30, as well as the deposition of polysilicon 42 over polysilicon gate electrode 12 (which forms no part of the present invention). It will be noted that unlike the polysilicon deposition in prior art FIG. 2, polysilicon 40 has not deposited over the surfaces of field oxide portions 6 and oxide spacers 16. This selective deposition of polysilicon 40 is made possible by the presence of thin layer 30 of lattice mismatched material.

Subsequent to formation of the structure as shown in FIG. 5, formation of the source/drain regions in the silicon substrate may be carried out by implantation, using an implant energy which will preferably only implant the dopant into the layer of polysilicon formed over the thin layer of lattice mismatched material. The thickness of the polysilicon sacrificial layer, relative to the desired thickness or depth of the source/drain regions to be formed in the silicon substrate, inhibits channeling, enables one to control the source/drain junction depths, and reduces damage to the underlying substrate, since the polysilicon layer is usually at least as thick or thicker that the desired depth of the implantation, and any ions which do penetrate deeper than the thickness of the polysilicon layer will only penetrate to the thin layer of lattice mismatched material.

After the implantation, the structure is subject to a conventional anneal, such as a rapid thermal anneal, to drive the implanted dopant ions through the polysilicon and the underlying thin layer of lattice mismatched material into the silicon substrate to form the desired shallow depth source/drain regions therein.

The result is the formation of shallow source/drain regions formed in the silicon substrate without risk of damage to the sidewall oxide insulators by etching, or damage to the substrate by implantation which would otherwise have to be annealed out. Formation of such shallow source/drain regions in the silicon substrate, in turn, means that the junction between the source/drain regions and the channel region beneath the gate will be very shallow as well, thus, inhibiting lateral migration of the dopant from the source/drain regions into the channel.

Figure 7:
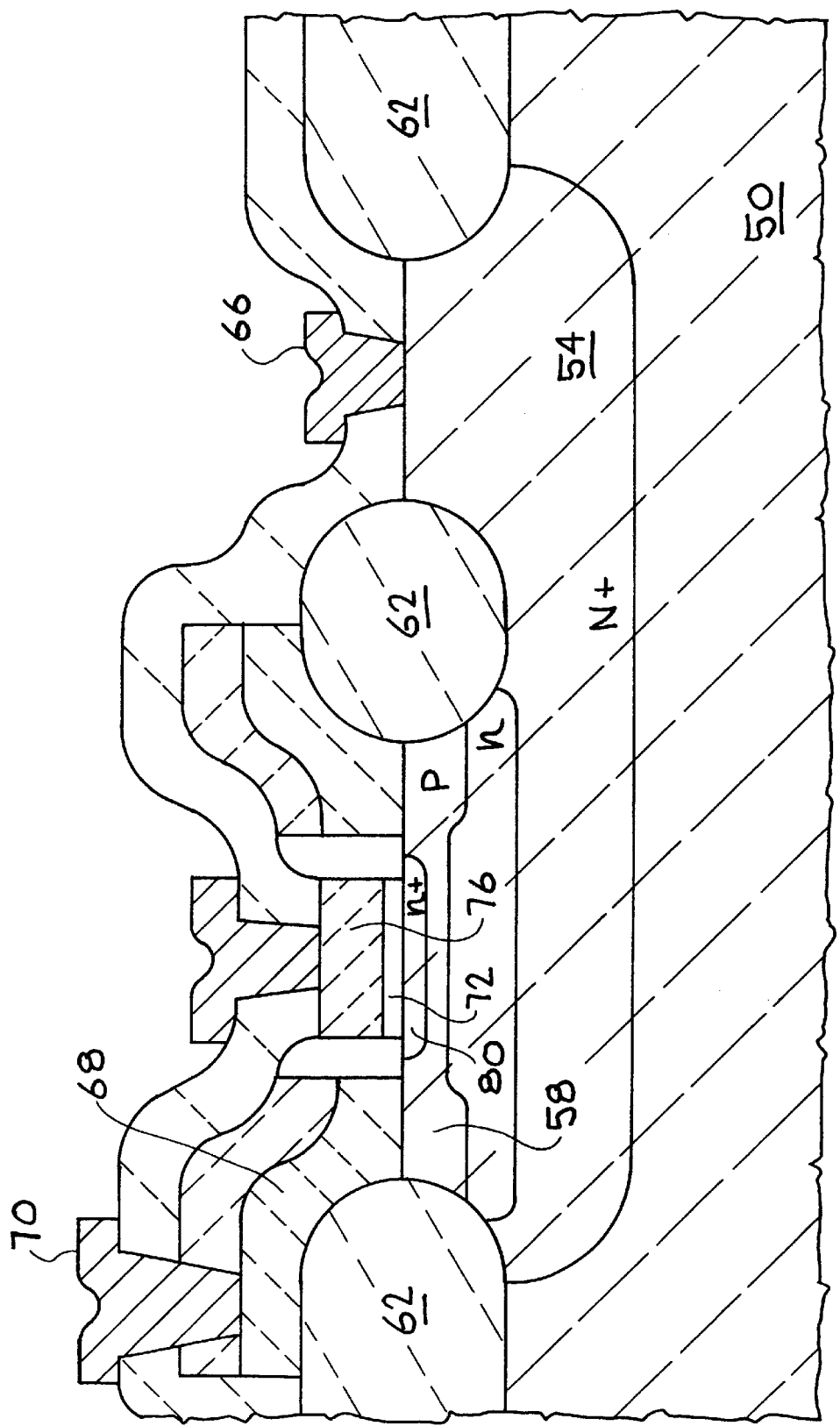
FIG. 7 is a vertical cross-sectional view of another embodiment of the invention wherein a thin layer of lattice mismatched material is formed over the base region of a bipolar transistor, in accordance with the invention, and a layer of polysilicon is selectively grown over the thin layer of lattice mismatched material to form the emitter.

In another embodiment, a lattice mismatched material may be utilized in the formation of bipolar transistors to replace the thin oxide layer beneath the emitter electrode. This is shown in FIG. 7 where a silicon substrate 50 is provided with a buried layer 54 forming the collector of a bipolar transistor, a base region 58 is formed in substrate 50 above buried layer 54, and oxide portions 62 are formed over substrate 50. A collector contact 66 is formed through oxide 62 and substrate 50 to buried layer 54, and a base contact 70 is formed through oxide 62 to base contact pad 68.

Normally, a thin oxide layer would be formed over emitter region 80 of substrate 50 and a polysilicon layer would be blanket deposited over the structure, followed by masking and etching of the polysilicon layer to form the emitter electrode. Instead, in accordance with the invention, a thin layer of a lattice mismatched material having a band gap higher than silicon, such as silicon germanium carbide (SiGeC), is selectively deposited over the exposed surface of emitter region 80, to form a thin layer 72 of lattice mismatched material. It will be noted that thin layer 72 of lattice mismatched material has replaced the oxide layer over the surface of emitter region 80, by reduction of the oxide layer. Polysilicon emitter electrode 76 is then selectively deposited only over thin layer 72 of lattice mismatched material, thus eliminating the need for further patterning of the deposited polysilicon.

In this bipolar application, the lattice mismatched material serves as a high band gap material which in turn, permits the subsequent deposition of a selective layer of polysilicon over the lattice mismatched material (rather than the current practice of blanket depositing polysilicon followed by masking and patterning of the polysilicon layer to form the emitter electrode) and reduces emitter-base overlap capacitance. In such an application the previously discussed SiGe alloy is not an ideal candidate for a seed layer because it has a narrower bandgap width than silicon and would cause a decrease in emitter injection efficiency. However, the use of a wider bandgap lattice mismatched material, such as silicon germanium carbide (SiGeC), as a seed layer to nucleate a selective polycrystalline silicon deposition, makes possible a subsequent selective polysilicon deposition which also improves emitter injection efficiency and transistor gain.

Thus, the process of the invention utilizes the deposition of a thin layer of a lattice mismatched material over portions of a silicon substrate not covered by thick oxide such as field oxide to reduce and replace native oxide and then to permit subsequent selective deposition on the thin layer of lattice mismatched material of a polycrystalline silicon material which, in the construction of MOS devices with shallow source/drain regions, can act as an implantation layer and a sacrificial layer to facilitate shallow doping and subsequent silicide formation; and in the construction of bipolar devices, can allow subsequent selective deposition of polysilicon on the thin layer of lattice mismatched material which will act as the emitter of the bipolar transistor, with the thin layer of lattice mismatched material acting as a high bandgap material between the base region and the emitter.

Having thus described the invention what is claimed is:

1. An active device for an integrated circuit structure having a layer of a lattice mismatched material selectively formed only over those portions of a single crystal silicon substrate doped to form active regions of said active device and a layer consisting essentially of polycrystalline silicon selectively deposited only over and in contact with said layer of lattice mismatched material.

2. The active device of claim 1 wherein said active device comprises a bipolar device and said layer of a lattice mismatched material is located only over a base region in said substrate.

3. An integrated circuit structure comprising:
a) a single crystal silicon substrate;
b) a layer of a material which is lattice mismatched with respect to silicon selectively formed only over doped portions of said single crystal silicon substrate; and
c) a layer consisting essentially of polycrystalline silicon formed only over and in contact with said layer of lattice mismatched material.

4. The integrated circuit structure of claim 3 wherein said lattice mismatched material comprises a material capable of reacting with native oxide on the surface of said portions of said single crystal silicon substrate to reduce said native oxide.

5. The integrated circuit structure of claim 4 wherein said reduction reaction between said native oxide and said lattice mismatched material forms a volatile reaction product.

6. The integrated circuit structure of claim 4 wherein said lattice mismatched material further comprises a material capable of forming a thermally and chemically stable deposition product on said portions of said single crystal silicon substrate after said reaction with said native oxide.

7. The integrated circuit structure of claim 6 wherein said lattice mismatched material is selected from the group consisting of germanium, an alloy of silicon and germanium, and a silicon germanium carbide.

8. The integrated circuit structure of claim 7 wherein the amount of germanium in said lattice mismatched material ranges from 1 mole % to 100 mole %.

9. The integrated circuit structure of claim 7 wherein the amount of germanium in said lattice mismatched material ranges from 6 mole % to 100 mole %.

10. The integrated circuit structure of claim 3 wherein the thickness of said layer of lattice mismatched material ranges from about 50 Å to about 500 Å.

11. In an integrated circuit structure wherein shallow source/drain regions will be formed in a single crystal silicon substrate, the improvement which comprises:
a) a layer of a material which is lattice mismatched to silicon selectively deposited only over portions of a single crystal silicon substrate where source/drain regions will be formed; and
b) a layer consisting essentially of polycrystalline silicon deposited only over and in contact with said layer of lattice mismatched material.

12. The integrated circuit structure of claim 11 wherein the thickness of said layer of lattice mismatched material ranges from about 10 Å to about 200 Å.

13. The integrated circuit structure of claim 11 wherein said lattice mismatched material comprises a material capable of reacting with native oxide on the surface of said portions of said single crystal silicon substrate to reduce said native oxide to form a volatile reaction product and to form a thermally and chemically stable deposition product on said portions of said single crystal silicon substrate after said reaction with said native oxide.

14. The integrated circuit structure of claim 11 wherein said lattice mismatched material is selected from the group consisting of germanium, an alloy of silicon and germanium, and silicon germanium carbide.

15. The integrated circuit structure of claim 14 wherein the amount of germanium in said lattice mismatched material ranges from 25 mole % to 100 mole %.

16. The integrated circuit structure of claim 14 wherein the amount of germanium in said lattice mismatched material ranges from 25 mole % to 70 mole %.

17. In an integrated circuit structure comprising a polycrystalline silicon emitter for a bipolar device formed over a single crystal silicon substrate, the improvement which comprises:

a) a base region formed over a portion of a single crystal silicon substrate;
b) a layer of a material which is lattice mismatched to silicon and which has a higher bandgap than silicon deposited only over said base region; and
c) a layer consisting essentially of polycrystalline silicon selectively deposited only over and in contact with said layer of lattice mismatched material.

18. The integrated circuit structure of claim 17 wherein said lattice mismatched material comprises a silicon germanium carbide.

19. In an integrated circuit structure wherein one or more shallow active regions of a semiconductor device will be formed in a single crystal silicon substrate, the improvement which comprises:
a) a layer of a material which is lattice mismatched to silicon selectively deposited only over and in contact with said single crystal silicon substrate where said one or more active regions will be formed; and
b) a layer consisting essentially of polycrystalline silicon deposited only over and in contact with said layer of lattice mismatched material.

20. An MOS device for an integrated circuit structure having a layer of a lattice mismatched material selectively formed only over regions in a single crystal silicon substrate doped to form source/drain regions of said MOS device and a layer consisting essentially of polycrystalline silicon selectively deposited only over said layer of lattice mismatched material.

21. In an integrated circuit structure wherein shallow source/drain regions will be formed in a single crystal silicon substrate, the improvement which comprises:
a) a layer of a material which is lattice mismatched to silicon selectively deposited only over portions of a single crystal silicon substrate where source/drain regions will be formed; and
b) a layer consisting essentially of polycrystalline silicon deposited only over said layer of lattice mismatched material to a minimum thickness sufficient to permit subsequent implantation of dopant into said polycrystalline silicon to be carried out to a depth not exceeding the depth of said polycrystalline silicon, whereby said implanted dopant is subsequently diffused from said implanted polycrystalline silicon through said layer of lattice mismatched material into said single crystal substrate thereunder to form said shallow source/drain regions.

22. In an integrated circuit structure wherein shallow source/drain regions will be formed in a single crystal silicon substrate, the improvement which comprises:
a) a layer of a material which is lattice mismatched to silicon selectively deposited only over portions of a single crystal silicon substrate where source/drain regions will be formed; and
b) a layer consisting essentially of polycrystalline silicon deposited only over said layer of lattice mismatched material, said layer consisting essentially of polycrystalline silicon having a thickness sufficient to permit subsequent reaction of said deposited polycrystalline silicon with a metal layer formed over said polycrystalline silicon to form metal silicide contacts to said shallow source/drain regions in said substrate.

* * * * *